United States Patent [19]

Bour et al.

[11] Patent Number: 5,509,024
[45] Date of Patent: Apr. 16, 1996

[54] DIODE LASER WITH TUNNEL BARRIER LAYER

[75] Inventors: David P. Bour, Cupertino; Robert L. Thornton, East Palo Alto, both of Calif.

[73] Assignee: Xerox Corporation, Stamford, Conn.

[21] Appl. No.: 345,100

[22] Filed: Nov. 28, 1994

[51] Int. Cl.⁶ .................................................. H01S 3/19
[52] U.S. Cl. ................................................ 372/45; 372/43
[58] Field of Search .......................... 372/43, 45; 257/18

[56] References Cited

U.S. PATENT DOCUMENTS

| | | | |
|---|---|---|---|
| 5,068,867 | 11/1991 | Hasenberg et al. | 257/18 |
| 5,079,601 | 1/1992 | Esaki et al. | 372/43 |
| 5,225,692 | 7/1993 | Takeuchi et al. | 372/45 |
| 5,289,486 | 2/1994 | Iga et al. | 372/45 |

OTHER PUBLICATIONS

[001d]

*Primary Examiner*—Rodney B. Bovernick
*Assistant Examiner*—Yisun Song

[57] ABSTRACT

Semiconductor lasers with thin tunnel barrier layers inserted between P cladding and P confining/active layers. The tunnel barrier layer creates an energy barrier which reduces the leakage of electrons from the active region, if the laser is a double heterostructure laser, or the confining region, if the laser is a quantum well, either single or multiple, laser into the cladding layer.

22 Claims, 3 Drawing Sheets

DIODE LASER WITH TUNNEL BARRIER LAYER

BACKGROUND OF THE PRESENT INVENTION

Several different types of visible light emitting semiconductor lasers based upon the $(Al_xGa_{1-x})_{0.5}In_{0.5}P$ materials system are currently being developed. In general, however, the performance of such lasers is limited by relatively weak electron confinement as compared to infrared AlGaAs diode lasers. This problem becomes more acute as laser output power increases, as the emission wavelength becomes shorter, and/or as the laser's operating temperature increases.

A major result of the weak electron confinement is electron heterobarrier leakage. Heterobarrier leakage is caused by thermally-excited electrons surmounting the confining heterobarrier at the interface between the cladding layer and either the active region in a double heterostructure laser or the confining region in a quantum well laser having a separate confinement heterostructure. In either case, electrons which have leaked into the p-cladding layer contribute to leakage current by diffusing and drifting toward the p-contact. Since hole mobilities in an AlGaInP cladding layer are relatively low, the drift component can be significant. Furthermore, since the confining potentials in an AlGaInP heterostructure are less than those in an AlGaAs system, the electron leakage current can be a much larger fraction of the total diode current.

Because high heterobarrier leakage in a semiconductor laser increases the temperature sensitivity of the laser's threshold current and reduces the laser's maximum operating temperature, semiconductor lasers based upon the $(Al_xGa_{1-x})_{0.5}P$ materials system having reduced heterobarrier leakage would be beneficial.

SUMMARY OF THE INVENTION

The present invention provides for visible light emitting semiconductor lasers with improved heterobarrier leakage characteristics. The improved leakage characteristics are a result of a thin tunnel barrier layer, beneficially of AlAs, AlGaAs, AlGaP, or GaP, which is located at the edge of the p-cladding layer. That tunnel barrier layer creates an energy barrier which reduces the leakage of electrons from the active (or confining) region into the cladding layer. Consequences of the reduced leakage include a reduced temperature sensitivity and a higher maximum temperature of operation.

BRIEF DESCRIPTION OF THE DRAWINGS

Other aspects of the present invention will become apparent as the following description proceeds and upon reference to the drawings, in which.

Figure 1:
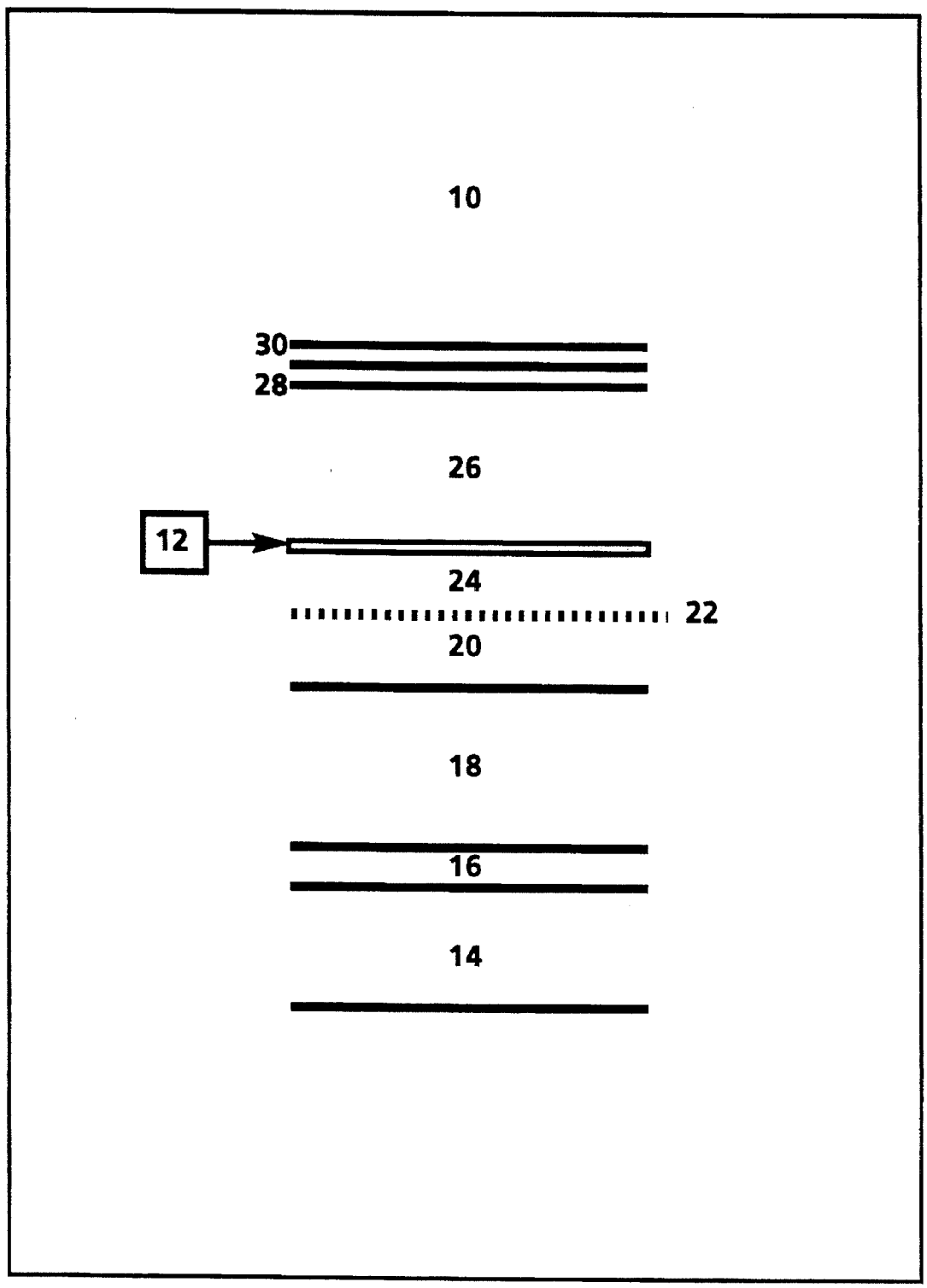
FIG. 1 is a schematic diagram of an AlGaInP laser which includes a tunnel barrier layer according to the principles of the present invention.

In the drawings, like numbers designate like elements. Additionally, the subsequent text includes directional signals which are taken relative to the drawings (such as right, left, top, and bottom, lower). Those directional signals are meant to aid the understanding of the present invention, not to limit it.

DETAILED DESCRIPTION OF THE ILLUSTRATED EMBODIMENT

The present invention provides for semiconductor lasers which have a tunnel barrier layer inserted at the edge of a p-cladding layer. The tunnel barrier layer creates an energy barrier which reduces the leakage of electrons from the active (or confining) region into the cladding layer.

FIG. 1 shows a schematic depiction of a prototypical $(Al_xGa_1)_yIn_{1-y}P$ laser 10 according to the principles of the present invention. Of particular interest in the laser 10 is a thin tunnel barrier layer 12 whose position and operation is described in more detail below. That tunnel barrier layer is beneficially comprised of: AlAs, AlGaAs (preferably with a high aluminum content), AlGaP or GaP.

The laser 10 has a GaAs substrate 14 on which is grown a GaAs or AlGaInP buffer layer 16. Over that buffer layer is an N-type cladding layer 18 (y= 0.5±0.05, 0.4<x<1.0). Over the cladding layer 18 is a lower confining layer 20 (y=0.5±0.05, 0.2<x<0.7). Over the confining layer 20 is an active region 22 (0.2<y<0.7, 0<x<0.4). The active region could be a single quantum well, multiple quantum wells, or a double heterostructure.

Over the active region 22 is an upper confining layer 24 (y=0.5±0.05, 0.2<x<0.7). The tunnel barrier layer 12 is over the confining layer 24.

Over the tunnel barrier layer 12 is a P-type cladding layer 26 (y=0.5± 0.05, 0.4<x<1.0). To facilitate the formation of ohmic metal-semiconductor contacts, a GaInP barrier reduction layer 28 and a GaAs $p^+$-cap layer 30 are placed on top of the cladding layer 26.

While the operating physics of lasers according to the principles of the present invention are not fully understood, the following provides the best theory known to the inventors. However, it is to be understood that the subject invention is defined by the appended claims and is not to be limited in any way by any inaccuracy in the following theory. Briefly, the tunnel barrier layer 12 between the confining layer 24 and the cladding layer 26 creates a barrier against electron leakage.

Figure 2:
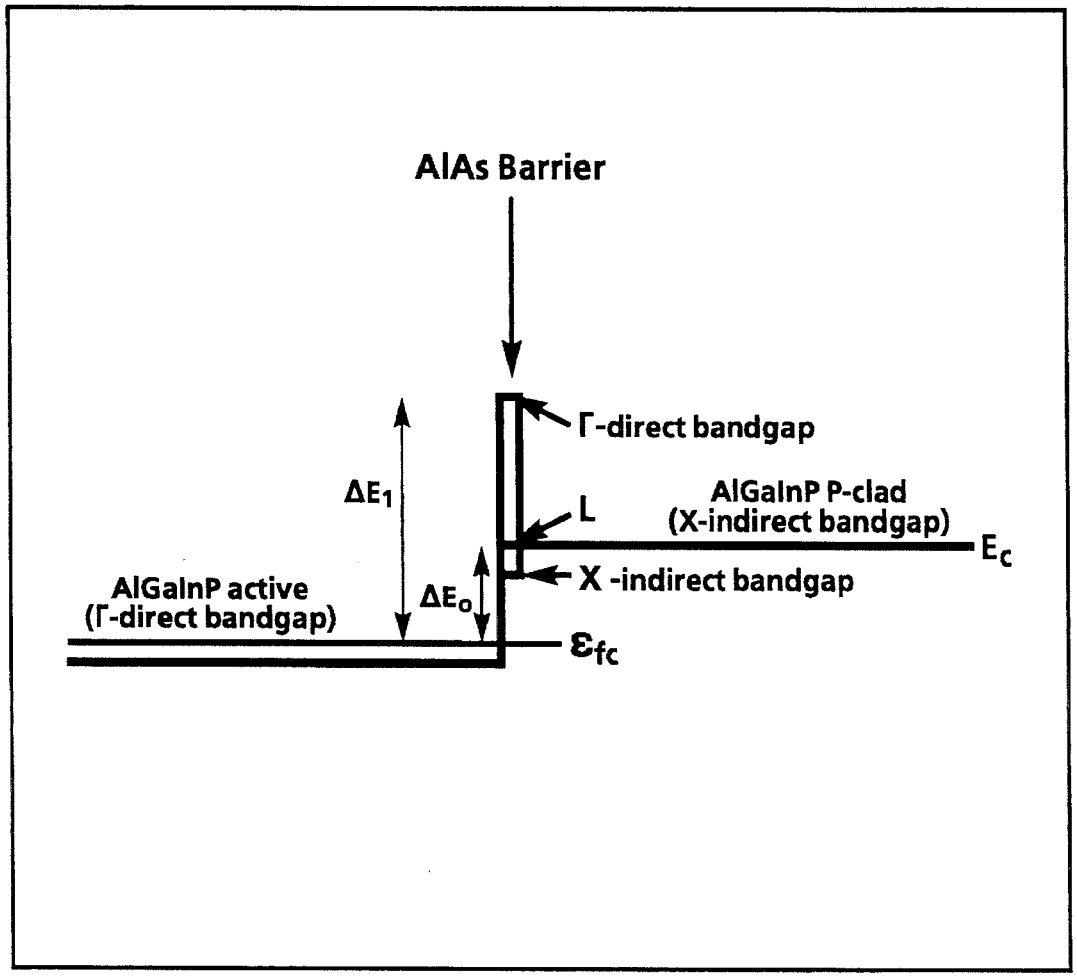
FIG. 2 shows the conduction band profile of the AlGaInP laser schematically illustrated in FIG. 1 when that laser has a double heterostructure active layer.
Figure 3:
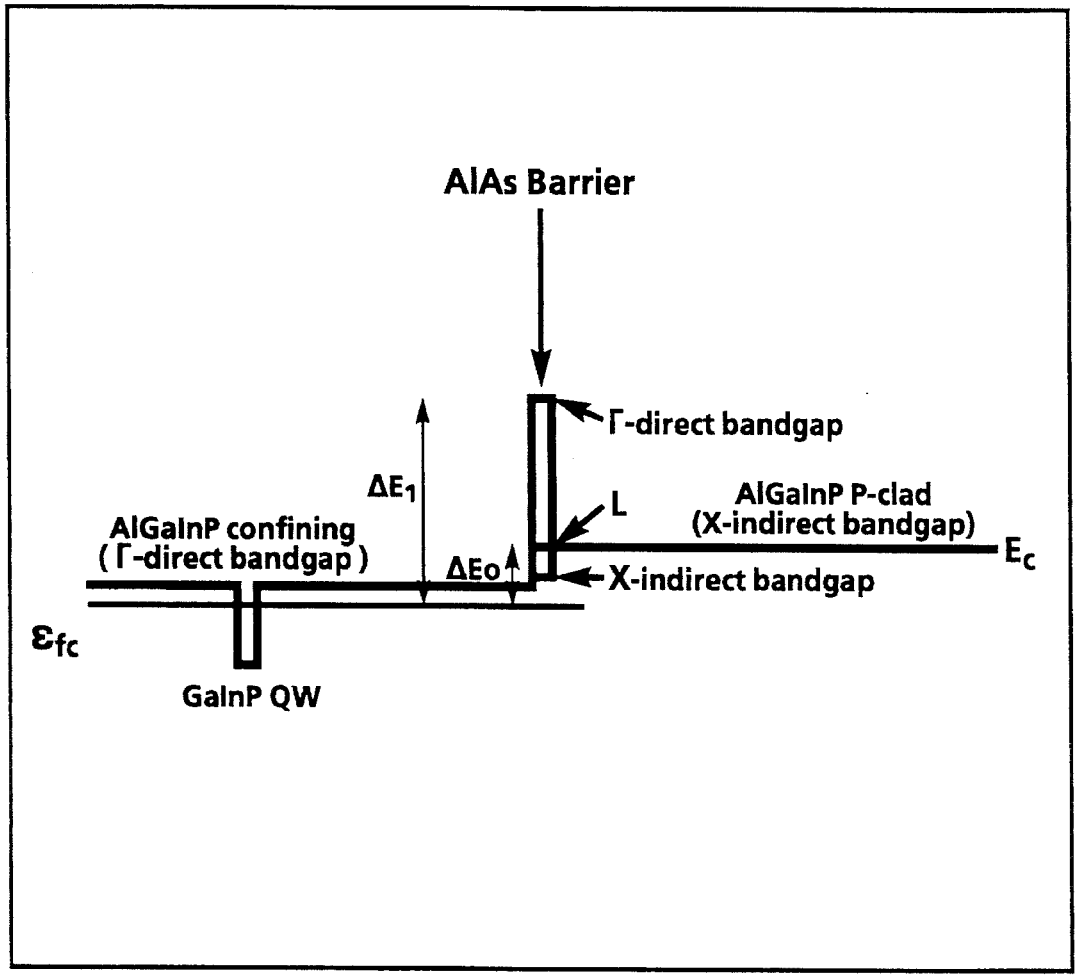
FIG. 3 shows the conduction band profile of the AlGaInP laser schematically illustrated in FIG. 1 when that laser has a quantum layer.

FIGS. 2 and 3 shows conduction band diagrams for AlGaInP lasers, a double heterostructure laser and a quantum well laser, respectively, having AlAs tunnel barrier layers according to the principles of the present invention. For electrons in the Γ-valley of the AlGaInP active/confining region, the tunnel barrier layers increase the effective barrier height by more than 0.5 eV. The tunnel barrier layers must be thin, less than 50 Å, so that the Γ-valley character of the barrier is retained (as opposed to the lower lying X- or L-valleys).

Experiments on short-period superlattices, resonant-tunnelling diodes, and heterostructure bipolar transistors (with an AlGaAs barrier at the emitter-base junction) have shown that an AlAs tunnel barrier layer presents a very high (Γ-like) barrier when it is sufficiently thin (<50 Å). On the other hand, as the barrier layer becomes thicker, the effective barrier height decreases to the X-valley (ie., the lowest energy band edge). Most importantly, for electrons starting in the Γ-valley of the active/confining region, the effective barrier height is the (highest-energy) Γ-bandgap energy of the AlAs layer, provided this layer is sufficiently thin. In essence, for a thin tunnel barrier the finite interband scattering time does not permit relaxation to the X- or L-valleys.

The valence band offset between AlAs and AlInP, although not well known, is estimated to be very small (approximately 50 meV). Consequently, since the AlAs tunnel barrier is p-doped like the AlGaInP cladding layer, there will be negligible valence band discontinuity at the P-clad/barrier layer interface. This is important since the tunnel barrier layer does not inhibit hole injection into the active/confining region, but does act as a highly selective barrier in confining electrons only. The X-bandgap and the L-bandgap energies do not provide electron confinement for Γ-electrons in the active region. Indeed, the energy difference between the X-gap of AlInP and the X- and L-gaps of AlAs (assuming the valence bands line up, either from the low offset and/or p-doping across the barrier) are 180 meV and 50 meV, respectively, both lower in energy compared to the AlInP (as shown in FIGS. 2 and 3). This emphasizes the requirement that the tunnel barrier layer be made thin so that the probability of interband scattering within the tunnel barrier is low, therefore making the Γ-energy the effective barrier. Moreover, in the quantum well device structure of FIG. 3, this structure is only effective when the confining region is direct bandgap, because only Γ-electrons will be confined by the AlAs Γ-energy barrier.

As a result of the small valence-band discontinuity between the AlGaInP P-clad and the AlAs tunnel barrier (whether achieved by p-doping, or an inherently small offset), the increase in the effective electron barrier height is determined by the Γ-bandgap energy difference between the P-clad and tunnel barrier layers. In FIGS. 2 and 3, the electronic confining potential without the AlAs tunnel barrier layer is $E_o$, while the maximum possible potential with the AlAs tunnel barrier is shown by $E_1$. Again assuming only a small valence band discontinuity, the increase in the electron barrier height is approximately the difference $(E_1-E_o)$, which is equal to the bandgap difference between AlAs (Γ-gap=3.02 eV) and Al(Ga)InP (X-gap=2.35 eV), or 0.67 eV. This represents a tremendous increase from the $E_o$ values of 0.1–0.2 eV which are normally encountered in such structures.

Of course, for the tunnel barrier to work as intended, it must be thin. Therefore, some electrons can still tunnel through the tunnel barrier, into the Al(Ga)InP P-clad and contribute to an electron leakage current. Still, such a tunnel barrier does prevent some fraction of the electrons from leaking out, thereby improving the performance of visible lasers. It should be noted that a series of several barriers, in the confining/active region (where the electrons are in the Γ-valley, rather than in the X-valley, like in a high-aluminum-content cladding-layer) could increase the fraction of confined electrons. In that case, the barrier separation should be chosen to avoid resonant tunneling.

The above describes the operation of lasers with AlAs tunnel barrier layers. However, tunnel barrier layers made from other materials are also suitable. For example, an $Al_xGa_{1-x}As$ tunnel barrier layer, preferably with x as close to 1.0 as possible, could also be used. The lower bandgap of $Al_xGa_{1-x}As$, however, compromises barrier height, and so does not make an as effective tunnel barrier layer. Likewise, since the tunnel barrier layer is thin, it needn't be constructed of a lattice-matched material. For instance, GaP or AlGaP, which have high direct bandgap energy (compared to the Γ-bandgap energy of AlAs, GaP's Γ-bandgap is lower, while AlP's is higher) could also be used to create tunnel barrier layers.

While the use of tunnel barrier layers in AlGaInP lasers is described above, primarily because electron leakage is a particularly important problem in such lasers, other types of laser diodes can benefit from the principles of the present invention. For example, an AlAs tunnel barrier layer could also be used to suppress leakage in AlGaAs laser diodes, especially at short (700 nm band) wavelengths where leakage current begins to appear. Similarly, a GaP tunnel barrier layer could reduce leakage in aluminum-free (GaInAsP/GaInP) 808 nm lasers, where leakage is an issue because of the relatively small confining potential; or in 980 nm (GaInAs/GaAs/GaInP) lasers (although leakage is not generally a problem in these structures, they are sometimes operated at elevated temperatures). Electron leakage also limits the performance of InGaAsP/InP lasers for λ<1.3 μm. Therefore, a tunnel barrier layer in these structures could also improve performance. Basically, the tunnel barrier layer may be effectively used in any laser diode structure where it is beneficial to reduce leakage by confining Γ-electrons to the active or confining region of the structure.

It is to be understood that while the figures and the above description illustrate the present invention, they are exemplary only. Others who are skilled in the applicable arts will recognize numerous modifications and adaptations of the illustrated embodiment which will remain within the principles of the present invention. Therefore, the present invention is to be limited only by the appended claims.

What is claimed:

1. A laser comprised of:

a substrate;

an N doped cladding layer adjacent said substrate;

a first confining layer adjacent said N doped cladding layer;

an active region adjacent said first confining layer;

a second confining layer adjacent said active region;

a P doped cladding layer adjacent said second confining layer, said cladding layer having a bandclap energy value associated therewith; and a tunnel barrier layer having an indirect bandgap energy value and a direct bandgap energy value associated therewith, the indirect bandgap energy value being less than the direct bandclap energy value and equal to or less than the bandgap energy value associated with said P doped cladding layer, said tunnel barrier layer disposed between said second confining layer and said P doped cladding layer, and being sufficiently thin such that electrons in the active region are prevented from entering said P doped cladding layer.

2. The laser according to claim 1, wherein said tunnel barrier layer is AlAs.

3. The laser according to claim 1, wherein said tunnel barrier layer is AlGaAs.

4. The laser according to claim 1, wherein said tunnel barrier layer is GaP.

5. The laser according to claim 1, wherein said tunnel barrier layer is AlGaP.

6. The laser according to claim 1, wherein said active region includes a single or multiple quantum well.

7. The laser according to claim 1, wherein said tunnel barrier layer is less than 50 angstroms in thickness.

8. The laser according to claim 1, wherein said active region emits visible light.

9. A double heterostructure laser comprised of:

a substrate;

an N doped cladding layer adjacent said substrate;

an active region adjacent said N doped cladding layer;

a P doped cladding layer adjacent said active region having a bandgap energy value associated therewith; and a tunnel barrier layer having an indirect bandgap energy value and a direct bandgap energy value associated therewith, the indirect bandgap energy value being lower than the direct bandgap energy value and equal to or less than the bandgap energy value associated with said P doped cladding layer, said tunnel barrier disposed between said active region and said P doped cladding layer, and being sufficiently thin such that electrons in the active region are prevented from entering said P doped cladding layer.

10. The laser according to claim 7, wherein said tunnel barrier layer is AlAs.

11. The laser according to claim 7, wherein said tunnel barrier layer is AlGaAs.

12. The laser according to claim 7, wherein said tunnel barrier layer is GaP.

13. The laser according to claim 7, wherein said tunnel barrier layer is AlGaP.

14. The laser according to claim 7, wherein said tunnel barrier layer is less than 50 angstroms in thickness.

15. The laser according to claim 7, wherein said active region emits visible light.

16. A visible light emitting laser comprised of: a substrate;

an N doped cladding layer adjacent said substrate;

an active region adjacent said N doped cladding layer, wherefrom visible light is emitted;

a P doped cladding layer adjacent said active region having a bandgap energy value associated therewith; and a tunnel barrier layer having an indirect bandgap energy value and a direct bandgap energy value associated therewith, the indirect bandgap energy value being lower than the direct bandgap energy value and equal to or less than the bandgap energy value associated with said P doped cladding layer, said tunnel barrier disposed between said active region and said P doped cladding layer, and being sufficiently thin such that electrons in the active region are prevented from entering said P doped cladding layer.

17. The visible light emitting laser according to claim 16, wherein said tunnel barrier layer is AlAs.

18. The visible light emitting laser according to claim 16, wherein said tunnel barrier layer is AlGaAs.

19. The visible light emitting laser according to claim 16, wherein said tunnel barrier layer is GaP.

20. The visible light emitting laser according to claim 16, wherein said tunnel barrier layer is AlGaP.

21. The visible light emitting laser according to claim 16, wherein said tunnel barrier layer is less than 50 angstroms in thickness.

22. The visible light emitting laser according to claim 16, wherein said active region includes a single or multiple quantum well.

* * * * *